United States Patent [19]
Lam

[11] Patent Number: 6,163,214
[45] Date of Patent: Dec. 19, 2000

[54] ANALOG SIGNAL AMPLIFIER

[76] Inventor: Peter Ar-Fu Lam, 20104 Wayne Ave., Torrance, Calif. 90503

[21] Appl. No.: 09/447,079

[22] Filed: Nov. 22, 1999

Related U.S. Application Data

[63] Continuation of application No. 09/010,440, Jan. 22, 1998, Pat. No. 5,990,739.

[51] Int. Cl.$^7$ ........................................... H03F 3/217
[52] U.S. Cl. .......................... 330/251; 330/207 A
[58] Field of Search .................. 330/10, 146, 207 A, 330/251; 381/120, 121

[56] References Cited

U.S. PATENT DOCUMENTS

| | | | |
|---|---|---|---|
| 5,631,605 | 5/1997 | Bailly | 330/146 |
| 5,990,739 | 11/1999 | Lam | 330/251 |

*Primary Examiner*—Steven J. Mottola

[57] ABSTRACT

A low cost analog signal amplifying circuit suitable for manufacturing in the form of an integrated circuit having an external load, two DAC, two signal control elements and two switching circuit means to reverse the direction of current flowing through said load.

32 Claims, 6 Drawing Sheets

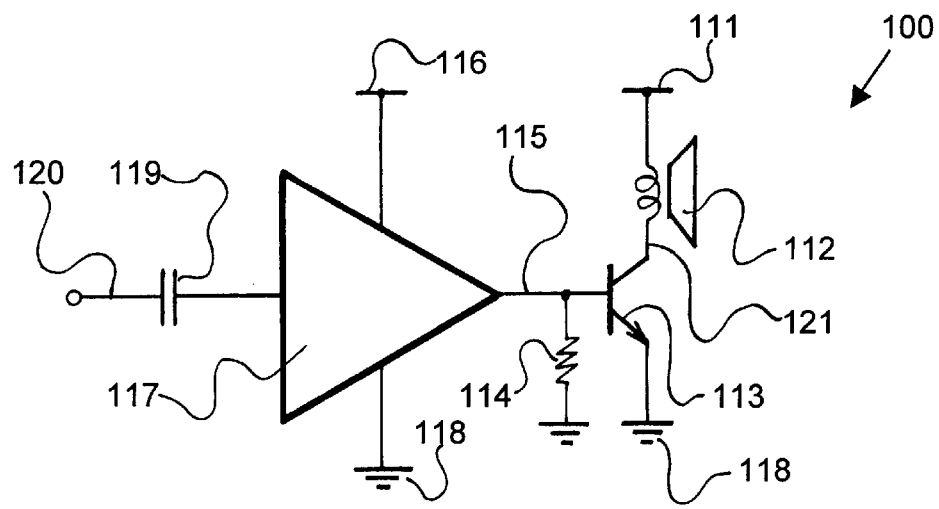
FIG. 1 PRIOR ART
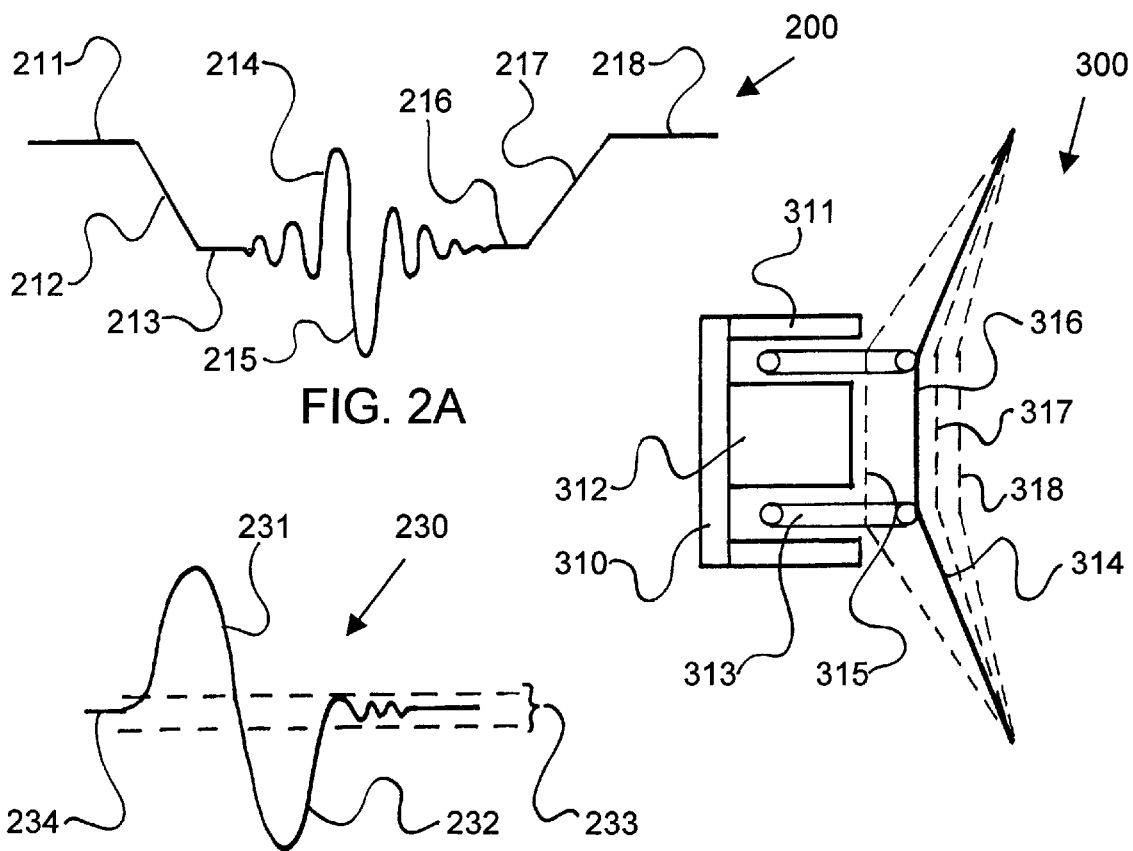
FIG. 2A
FIG. 2B
FIG. 3

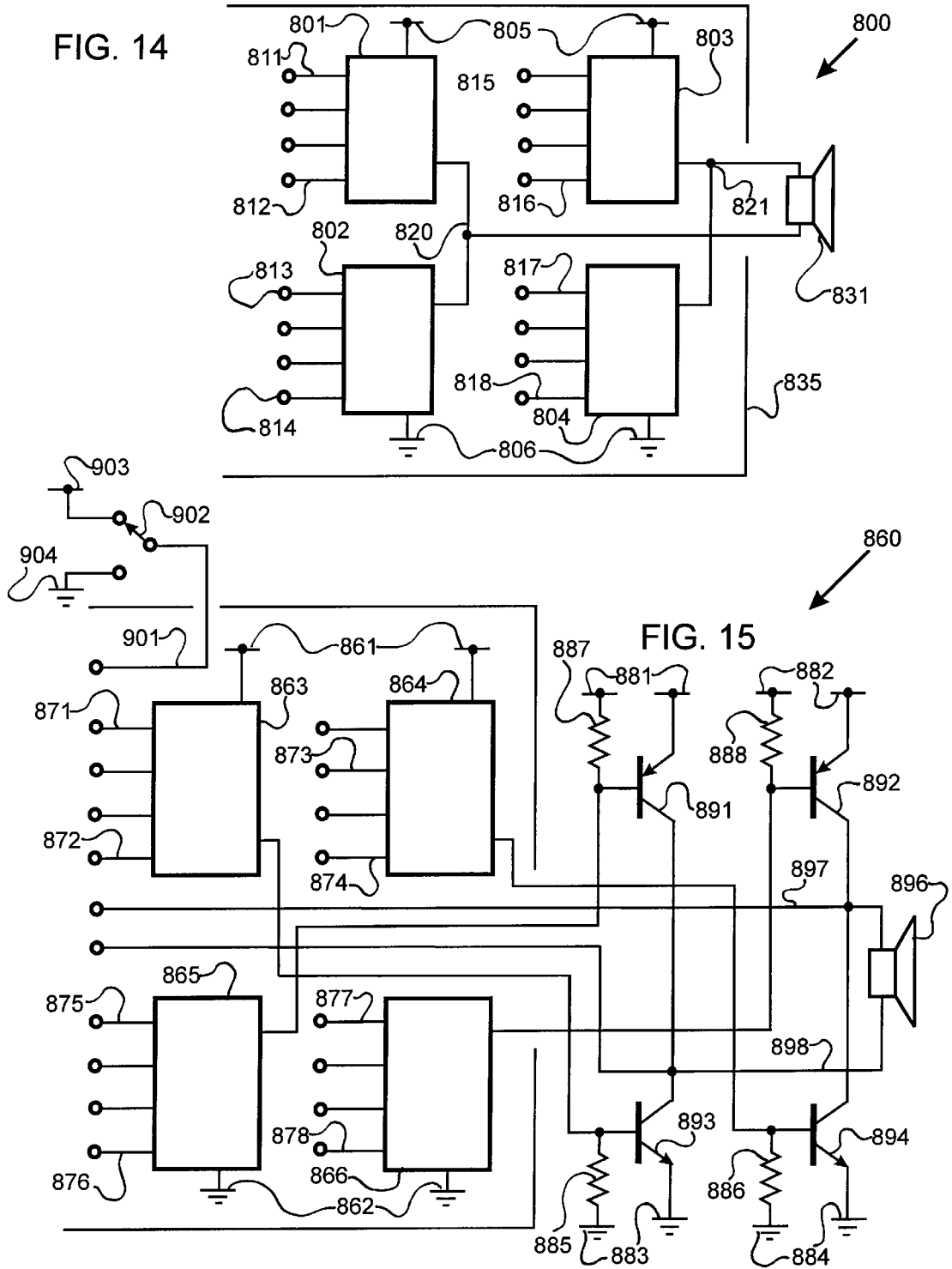

ANALOG SIGNAL AMPLIFIER

RELATED APPLICATIONS

This is a continuation in part of U.S. application Ser. No. 09/010,440 filed Jan. 22, 1998 now U.S. Pat. No. 5,990,739. This application is incorporated herein by reference.

FIELD OF THE INVENTION

The present invention relates to a low cost, low output impedance amplifier, particularly to an amplifier delivering an analog signal to a low impedance load such as a speaker.

BACKGROUND OF THE INVENTION

Traditional low cost audio amplifying circuit used by consumer electronic products makes use of class A amplifier or push-pull amplifier. Current driving class A amplifier is very popular in low end voice synthesizing chips, melody chips and sound effect chips due to its simplicity and low cost. The major disadvantage of the class A amplifier and push-pull amplifier is the poor power efficiency. Another disadvantage of the single transistor class A amplifier is that the output signal usually suffers from the nonlinear distortion resulted from the nonlinear transfer curve of the driving transistor. The objective of the invention is to develop a low cost high efficiency analog signal amplifier particularly suitable for use to drive an audio signal to a speaker.

SUMMARY OF THE INVENTION

The present invention is directed to the design of a low cost high efficiency analog signal amplifier working under a single power supply; particularly an amplifier built into an integrated circuit, hereafter referred as an IC. Traditional low cost class A amplifier making use of a single transistor offers low component cost. The amplifier IC cost is reduced because only a small base current is to be delivered to the driving transistor and therefore eliminating the requirement of the integrated circuit to handle high power dissipation. This circuit is commonly used in low cost consumer products making use of a voice or sound synthesizer chip; voice recording/playback chips and melody chips in which the audio signal represented by digital data is converted into an analog signal to be delivered to the base of a driving transistor. The disadvantage of this arrangement is that the speaker is driven in a unipolar direction such that only half of the dynamic range of the speaker is utilized. As compared with a bi-directional speaker driving circuit, much higher power is required by the speaker to deliver the same amount of sound volume. Besides, the speaker diaphragm in the unipolar configuration reaches the saturation position at a lower output power; the peak volume delivered is therefore smaller. On the driving circuit side, it is required to build up a midpoint bias level for the driving transistor during the idle or cross over period of a sound wave. The midpoint biasing level contributes a DC current flowing through the load when there is no input signal. A further disadvantage of the single transistor class A amplifier is caused by the nonlinear transfer curve of the driving transistor which provides a significant nonlinear distortion to the output waveform. Another commonly used analog signal amplifier is the arrangement of a push-pull circuitry wherein one transistor is arranged to source current from the speaker and another one is arranged to sink current from the speaker. If the output current is AC coupled to the speaker, the unipolar direction disadvantage discussed above is eliminated. This circuit is represented by the commonly used audio amplifier LM386 in the form of an integrated circuit. The typical disadvantage of this arrangement is that there is a possibility of cross over distortion when the output signal is hand over from the sourcing transistor to the sinking transistor or vice versa. The power driving capability of the amplifier is also limited by the power dissipation capable to be handled by the integrated circuit. Besides, the peak amplitude of the signal delivered to the speaker is limited to equal or less than that of the power supply voltage which in result, may not make full use of the dynamic range of the speaker. In order to provide higher efficiency power output and less distortion, a higher capacity capacitor is required. This capacitor increases the cost of the product. Another type of push-pull circuit make use of a push-pull transformer. In addition to the disadvantages similar to the capacitor coupled push-pull circuit discussed before, the transformer push-pull circuit is suffered from four more disadvantages. Firstly, the transformer adds more cost to the product than a capacitor. Secondly, transformer is less compromising in size. This is particularly a problem when the product is required to be slim or small in size. The third disadvantage is that transformer circuit are of lower efficiency than a direct driving circuit. The fourth disadvantage is that the transformer contributes to a tuning circuit and affects the frequency performance of the amplifier. Many push-pull amplifier requires two power supply voltages; a +ve voltage and a −ve voltage. The first disadvantage of this type of push-pull amplifier is that the two power supplies make the power management circuit more expensive. For example, the power on-off switch requires a two-pole switch instead of a one-pole as in a single power supply system. Another disadvantage when compared with the subject invention is that the peak to peak voltage across the speaker is always less the sum of the +ve voltage and the −ve voltage, the total voltage available. A further disadvantage of the dual supplies push-pull circuit is that the power driver circuit is more difficult to interface with the signal source circuit, such as a D/A circuit integrated with a microprocessor which runs on a single voltage. Another significant disadvantage of the dual supplies push-pull circuit is the unbalance of current draw. The power content of the +ve waveform and the −ve waveform may not be identical. The situation is particularly worst when the microprocessor or supporting circuit runs on one of the voltage supplied, usually the +ve voltage supply. The imbalance in current draw is particularly important when batteries are used. If the product is powered by batteries, usually one group of batteries are drained before the other group is exhausted. Users usually are unaware that one group of batteries are still usable and they tend to replace all the batteries when the performance of the product is significantly deteriorated due to the drained group of batteries. As a result this configuration is not environmental friendly. Besides, when one group of battery supply is heavily drained than the other group, this group of voltage will build up higher internal impedance than the other lightly load power group. As a result, the performance of the signal portion power by one power group will be different from the other one because the performance of most power driver circuit depends on the voltage and internal impedance of the power supply. Applicants prior patent application U.S. application Ser. No. 09/010,440 disclosed a four switches one signal regulator design, a solution to eliminate most of the above mentioned disadvantages and provides a analog signal of almost two times of the power supply voltage across the load. However, this design requires two switches and one signal regulator in series with the load all the time. The voltage drop contributes by these switches and signal regulator less undesirable especially in a low voltage application. Another commonly used push-pull circuit makes use of four switches to provide PWM encoded pulses to the speaker load. The disadvantage of this type of push-pull circuit is that a high sampling frequency is required by the PWM signal otherwise the carrier frequency of the signal will be audible by the user. However, when the carrier frequency of the PWM signal falls outside the audible range of the human ear, it also falls outside the most efficient operation frequency range of the speaker. As a result, a lot of power delivered to the speaker load is lost in the high frequency response range of the speaker. Since PWM push-pull works on a different theory when compared with analog push-pull circuit, the PWM circuits are not treated as prior art references for detail discussion and comparison.

The objective of the present invention is to provide a circuit design configuration suitable for using by the low cost sound or melody chips, making use of the full dynamic range of the speaker and completely eliminating the midpoint DC biasing level, and using a single power supply. Another objective of the invention is to provide a low cost analog signal amplifier in the form of an IC, by combining the functional block of the voice or melody generator, such as the analog signal decoder and the DAC into this analog speaker driving circuit, and to achieve the similar function.

In a preferred embodiment, the source signal is processed to provide a suitable base current to the driving or amplifying transistor. The transistor in turn amplifies the input signal and drive the output current through the load. In a typical application of an audio amplifier, the load is represented by a loud speaker. The first terminal of the load is connected to a first switch which may connect the terminal to a power source. The second terminal of the load is connected to a first amplifying transistor and then to the other terminal of the power source. Similarly a second switch and a second amplifier transistor are provided. During the relative positive portion of an input signal, the first switch connects the first terminal to the power source and the amplifying transistor connects the second terminal to the ground. In this situation, the amplified signal current flows through the load in a first direction. During the relative negative portion of the input signal, the second switch connects the second terminal to the power source and the second amplifying transistor connects the first terminal to the ground. In this situation, the amplified signal current flows through the load in a second opposite direction. The amplitude of the current flowing through the load is controlled by the two amplifier transistors. The configuration therefore provides a bidirectional current flow to the speaker. The advantage of this arrangement as compared with that of the parent patent application is that one voltage drop of the switch is eliminated and makes it particularly suitable for very low voltage applications. The cost for this benefit is that a second amplifier circuit and a second power transistor is required. In an alternate arrangement, two to four current driving transistors are arranged to perform both the switching and load current regulating or control function. In another preferred embodiment, the digital to analog converter of the sound or melody chip is modified into two to four DAC groups with current characteristics suitable to drive the two to four current driving transistors. Usually the current driving transistors are located outside the IC. The structure of the data sent to the DAC is also preferable to be custom designed to match the operation principle of the invention; that is to include a polarity bit for directing which DAC or current driver to be turned on. The data content is also required to be modified to reflect the absolute amplitude away from the neutral point instead of from the ground point representing the valley of a waveform. The neutral point is defined by the cross over region when no current flow through the load. In case the load is of relative higher impedance, such as in the range of 64 ohm to 100 ohm in the situation of headset speakers, the DAC design inside the IC can be enhanced to provide higher current driving capability and to drive the speakers directly.

When the movement of the speaker diaphragm is analyzed, it can be observed that during the upper portion cycles time, the diaphragm moves to a first direction and during the lower portion cycle time, the diaphragm moves to a second opposite direction. It means both the dynamic range of the speaker diaphragm in the first and second directions are fully utilized and higher sound pressure is produced as compared with the unidirectional movement of the traditional single transistor low cost class A amplifiers. When the signal voltage acrossing the speaker terminals is considered, it can be observed that the invented design offers double driving voltage across the speaker when compared with traditional audio amplifiers. During the peak swing of the relative position period or the relative negative period, the voltage across the speaker terminals can be approximately equal to the voltage of the power source minus the saturated voltage drop of the driving transistor and the switch. That is represented by the equation "Vs−2×Vce", where Vs is the power source voltage and Vce is the saturated voltage drop of the driving transistor. Assuming Vs=6V, Vce=0.3V per amplifying or switching transistor, a 5.4V peak voltage swing is achievable for each of the upper and the lower portion cycle time. It means the present invention is capable of offer 10.8V peak to peak signal swing across the speaker as compared with 5.7Vpp in traditional single transistor class A amplifier; 4.6Vpp as achieved by traditional push-pull amplifier or 10.2V of the amplifier circuit disclosed in the parent application. The higher peak to peak voltage swing implies higher power is possible to be delivered by the invented amplifier design. If the power to be delivered to the load is to be maintained when compared with the traditional amplifier discussed, the higher voltage swing implies the impedance of the load can be increased and eventually the current delivered to the amplifier can be reduced in proportion. When compared with prior art single transistor class A amplifier, the DC biasing component of the current is eliminated and four times reduction in peak operation current is possible to maintain the same output power depends on the input signal amplitude. Research of the inventive steps indicates that the reduction of the peak operating current has a significant meaning to the power efficiency of battery operated devices although the output power is maintained at the same level. This is particularly true because typical alkaline and carbon zinc has a different power capacity when discharged at different current. The total ampere-hour of a battery is longer when it is discharged at a lower current. The lower average current consumed by the present invention provides significantly longer battery life than traditional low cost single transistor class A amplifier; even when the same power is delivered to the speaker. Experimental study indicates that battery life can be easily extended by more than two times depends on the range of operating current. Substantial higher battery efficiency without sacrificing the power performance reduces the quantity of consumer battery dumping and therefore significantly helps to improve the green environment of the earth.

In the situation of an integrated circuit, the current amplifying transistors are preferably to be arranged external to the IC so that the heat dissipation shared with the load concentrates on the external current regulating transistors. The IC is required to deliver only a small base current just enough to drive the transistor and therefore very little heat energy is dissipated on the IC. This low power arrangement is very helpful to simplify the temperature tolerance and power handling requirement when designing the IC which in turn enable a smaller IC size, simpler and cheaper packaging requirement. Eventually the cost of the IC is significantly reduced. It should be noted that the amplifying transistor which constitutes the analog signal control means is not limited to regular NPN or PNP power transistors, but also includes any other analog signal control means or amplifying devices such as FET, MOS, CMOS or integrated power amplifiers. Similarly the switching control means refer to any circuit capable of providing current switching function. Such device includes but not limited to transistors, FET, MOS and any other switching devices.

The source signal to be amplified can be an external analog signal derived from an external source as in the example of an audio speaker amplifier. Alternatively, it can be an analog signal decoded from digital data as in the example of a sound or melody chip. Such digital data can be stored inside a processing integrated circuit as in the case of sound chips or stored in memory outside said integrated circuit as in the design of some telephone answering or voice recording/playback chips.

Due to the nonlinear transfer curve of the driving transistor, the input base current is preferably to be compensated according to different amplitude level of the input signal so as to provide a more linear transfer characteristic. In the situation of a digital to analog converter as in the example of a sound or melody chip, the decoded digital sample can go through a software look up table which provides an image opposite transformation to the nonlinear characteristic of the driving transistor and in turn compensate and transform the output signal to provide a more linear transfer characteristic. For example, the DAC output can be set to start at 0.5 V merely to turn on the current driving transistor when the analog signal is close to the neutral no current level. It will then operated all the way up to the point before the base current is saturated. Instead of starting from zero volt as in the source analog signal, the software look up table provides a DAC output merely turns on the transistor. Many other linearity compensation techniques disclosed in prior art inventions and common to skill in the trade can also be integrated into the invention to provide a linear amplification of the source signal.

In an alternate embodiment, the output signal in between the driving transistor and the connected terminal can be feedback to the amplifying circuit for gain compensation due to variation of individual transistor gains. The feedback control function can be achieved with an internal analog circuit, or digitally by a counter, DAC, and successive comparison method traditionally used in the art. Various gain compensation methods in the art with a feedback design is applicable to improve the performance of the invention.

When the invented technology is applied into a signal reproducing application such as a voice decoding device making use of DM (Delta Modulation) or ADPCM, the exact zero crossing level represented by the digitally encoded data may be difficult to be determined because every sample of the signal is relative to the previous signal sample decoded. As a result the neutral zero position of the push-pull circuit is undefined. A pop sound may happen when there is a small DC level exists across the speaker and the driving signal transits between the relative positive cycle time and the relative negative cycle time. Because there is no DC biasing across the speaker, the slope method of avoiding the pop sound as shown in waveform FIG. 2A is no longer applicable. In order to avoid the pop sound, the current feeding through the speaker is preferably be cut off either by turning off the amplifying transistor or the signal switches. An alternate way to resolve the problem is to rebuild the neutral no current position of the amplifier. This process can be achieved by software, hardware or their combination. A method to resolve the problem is to take the middle value of the highest possible amplitude permitted by the system. A further step is required to compute the positive amplitude or negative signal amplitude away from the defined neutral position. Besides, a sign signal is generated in parallel to tell which group of switch and signal control or amplifier circuit to be activated. Any operation path of the sign or polarity signal constitutes the polarity signal control means recited in the claims. If the encoding system and decoding system are considered as a whole to take the full advantages of the invention, the source analog signal is preferred to be sampled and encoded to conveniently providing the sign bit and the directional amplitude data required. A typical example in the situation of n bits digitally encoded PCM is to directly provide a sign bit plus n−1 amplitude bits for each sample of the signal. Various modifications in the encoding process to suite for different kinds of encoding or compression algorithms are possible; all these modifications are considered to be within the scope of the subject invention as long as the corresponding decoding process provides a sign bit to tell the direction of current flow through the load and the amplitude data representing the variation of the current flowing through the load.

The invented technology is applicable to audio amplifiers, either in analog form or in digital form, where the digital data is eventually converted into an analog signal to drive a load as in the application of sound generating chips, answering machine chips and other type of voice recording/playback chips used in various consumer electronic products. In additional to audio amplifiers, embodiments of the invention finds utility in other analog signal driving applications, for example, variable speed DC motor and servomechanism.

The novel features of the invention are set forth with particularly in the appended claims. The invention will be best understood from the following description when read in conjunction with the accompanying drawings.

BRIEF DESCRIPTION OF DRAWINGS

FIG. 1 is a traditional single transistor audio driving circuit to drive a speaker.

FIG. 2A is a typical audio signal waveform to be delivered to the speaker load.

FIG. 2B illustrates the upper and lower portion cycle duration of an analog signal.

FIG. 3 is the sectional illustration of a speaker.

FIG. 14 is a further enhancement of the embodiment of FIG. 10 with four DACs for direct drives.

FIG. 15 is an enhancement of the embodiment of FIG. 14 with external current drivers.

DESCRIPTION OF THE PREFERRED EMBODIMENT

Figure 4:
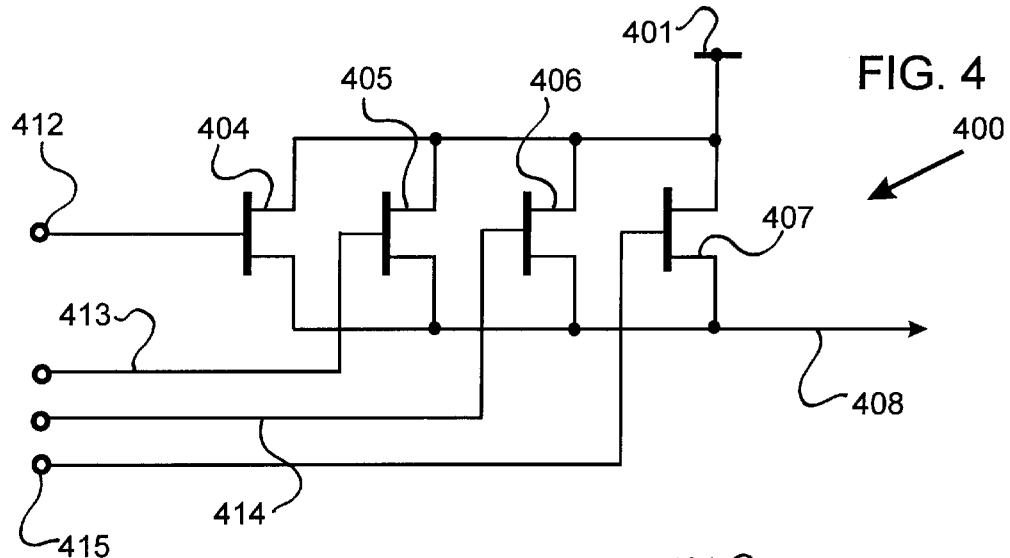
FIG. 4 is the schematic illustration of a digital to analog converter and current driver.

FIG. 1 shows a traditional single transistor audio driving circuit 100 to drive a speaker 112. An analog source signal such as an audio signal is fed into the amplifier 117 configured as an integrated circuit (I.C.). The capacitor 119 eliminates the DC component of the source signal. The processed signal is fed into the base of an amplifying element, which is represented by the NPN transistor 113. The resistor 114 adjusts the base current allowed to flow into the amplifying transistor 113. The amplified current flows through the load, represented by the speaker 112 and the amplifying transistor 113.

FIG. 2A illustrates the waveform of a typical signal measured at junction 121 of FIG.1. Before an effective signal is processed, the output of the transistor 113, that is junction 113 stays at high voltage level approximate to the power source voltage (Vs) potential at junction 111. The voltage at junction 121 is then lowered to approximately half of Vs to level 213 before a signal is to be produced. This is referred as providing the biasing of the amplifying transistor 113. The signal amplified comprises of the relative positive portion 214 and the relative negative portion 215. After the signal is produced, the voltage at junction 121 returns to power source level 218. The voltage slopes 212 and 217 are preferably to be added by the amplifying circuit to eliminate the pop sound generated by the sudden rise and fall of the source waveform. FIG. 2B illustrates a typical analog signal 230 comprising a relative positive portion 231 and a relative negative portion 232. The neutral zero signal level is represented approximately by the mean signal level 234. This signal can be passed into a zero crossing detector to provide a relative positive portion signal control pulse during the upper portion of the signal 231 and another relative negative portion signal control pulse during the lower portion of the signal 232. When a small feed back signal is provided to the zero crossing detector, a hysteresis effect can be introduced such that there is a small signal region 233 when neither the upper signal portion control pulse not the lower signal portion control pulse is generated. The presence of the no signal or small signal region 233 is significant to the power efficiency of the circuit 100 of FIG. 1 since the midpoint biasing level represents a steady DC power dissipation occurs in both the speaker 112 and the transistor 113.

Attention is now directed to FIG. 3, which shows the location of a diaphragm of a speaker receiving the analog signal of FIG. 2A. The speaker 300 comprises of a diaphragm 314 to move the air and produce sound. The diaphragm 314 is attached to a coil 313 which is positioned inside the magnetic field formed by the magnet 312 and the magnetic circuit 310, 311. A variable current representing the audio signal passing through the moving coil 313 causes the diaphragm 314 to move according to the amplitude and direction of the signal received. When no current is received as in region 211 or 218 of the waveform shown in FIG. 2A, the speaker diaphragm 314 stays at the equilibrium position 316. The small signal midpoint biasing level of the signal 213 and 216 is represented by the position 317 of the diaphragm. The peak signal level 215 is represented by the diaphragm position 318. It can be observed that in the situation of a single transistor class A amplifier shown in FIG. 1, the speaker diaphragm travels in between the positions 316 and 318. Besides, it requires a heat dissipating DC bias level 213 and 216 which is represented by the unstable diaphragm position 317. It is an objective of the invention to position the speaker diaphragm at the 316 position during the neutral positions 213 and 216. It is also an objective of the invention to increase the dynamic range of the speaker from position 315 to 318 instead of 316 to 318 as achieved by the prior art.

Figure 5:
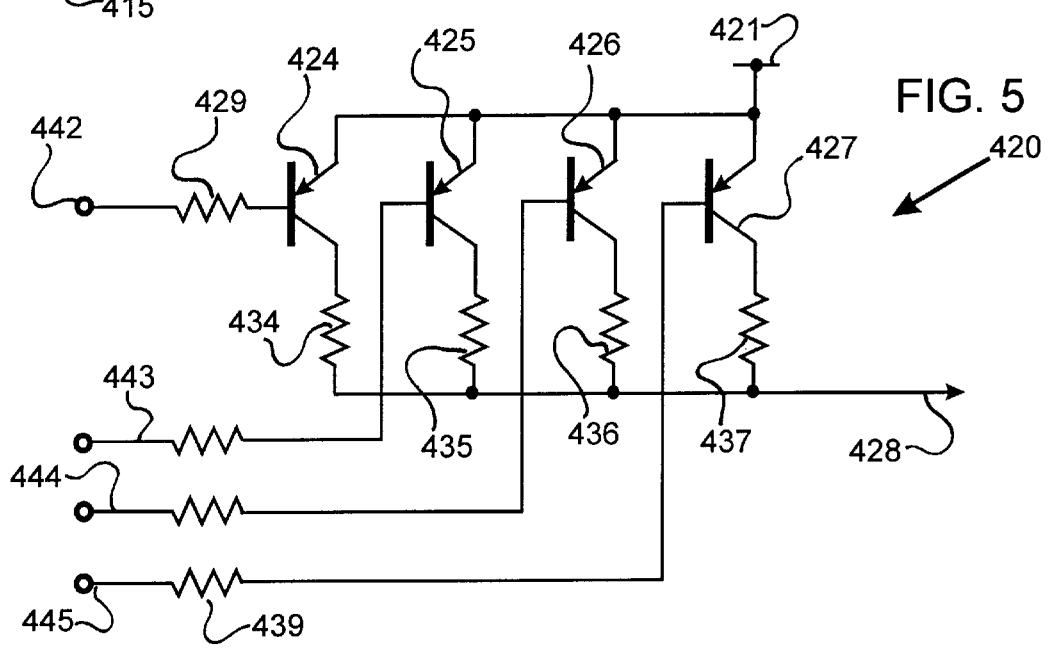
FIG. 5 is another embodiment of a digital to analog converter and current driver.
Figure 10:
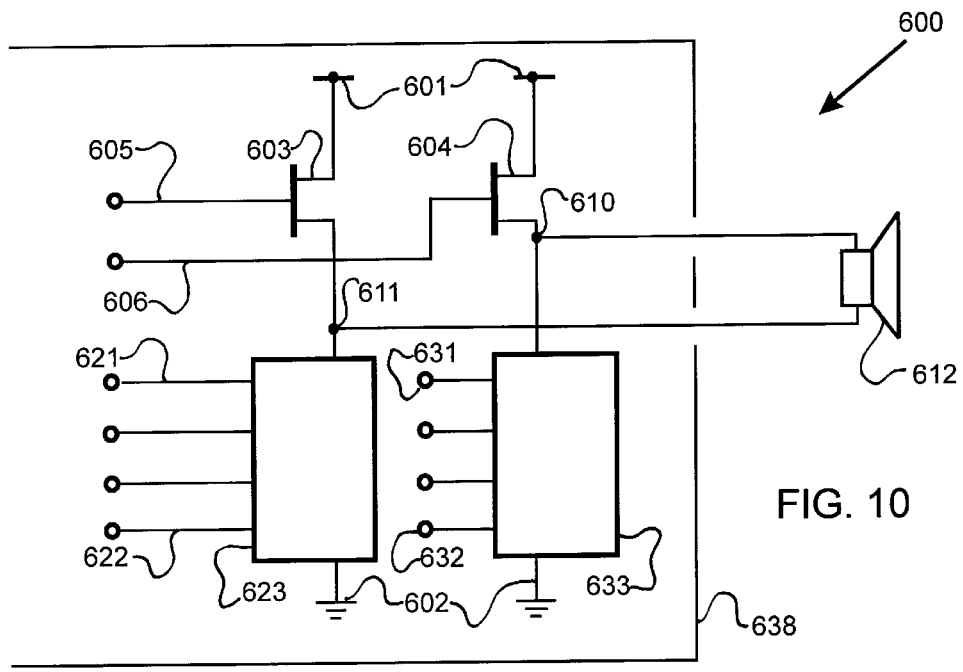
FIG. 10 is an embodiment having two switches and two direct drive DACs.

Attention is now drawn to FIG. 10 which illustrates a first preferred embodiment of the invention. Switches 603 and 604 are arranged with D/A converters 623 and 633 inside an IC 638 to form a push-pull amplifier to the speaker load 612. Input terminals 621 to 622 constitutes the digital data input fed to the DAC 623. Input terminals 631 to 632 constitutes the digital data input fed to the DAC 633. During the relative positive portion 231 of the waveform 230 of FIG. 2B, switch 604 is turned on and the current flowing through the load 612 is controlled by the DAC 623 which is considered as an analog signal control device. FIG. 4 and FIG. 5 illustrates different embodiments of the DAC which are suitable to provide a limited current driving the load directly. In FIG. 5 different values of the resistors 434, 435, 436 and 437 provides different output current when each of the transistors 424, 425, 426 and 427 is turned on. If resistor 434 is of value R, resistor 435 is of value 2R, resistor 436 is of value 4R and resistor 437 is of value 8R, the circuit forms a four bits DAC to decode a four bits PCM encoded data. The terminal 442 forms the input pin of the MSB, most significant bit of the encoded data and the terminal 445 forms the LSB, least significant bit of the PCM code. The DAC 420 of FIG. 5 is suitable to provide direct current drive to the load if the load impedance is higher than that of the resistors 434 to 437. In MOS fabrication, the DAC converter 420 of FIG. 5 is equivalent to the DAC 400 of FIG. 4. Each of the MOS switches 404 to 407 are designed to be of different physical sizes so as to deliver different limiting currents when switched on. The DAC 400 of FIG. 4 and DAC 420 of FIG. 5 are both current sourcing DACs. Current sinking DACs can be achieved by many other ways known in the art such as changing the NPN transistors to PNP transistors and NMOS switches to PMOS switches respectively. Since the DACs are capable to source or sink current to a load of relative high impedance, such as a 100 ohm head phone, FIG. 10 illustrates an application when the load is directly driven by the switches 603, 604 and DACs 623, 633, all located inside the IC 638. Alternatively the positions of the switch and the current sinking DACs can be interchanged to arrange a current sourcing DAC and a current sinking switch as discussed above, to achieve the similar result. It can be observed that the DAC can be made by an array of switches. The turning on and off of the switches defines the current regulating function of an analog signal control means, if the load is to be driven directly. Alternatively, since all switches of an DAC can be turned off, the DAC disclosed contains the switching function when the digital input data instruct the DAC not to conduct any current.

Figure 6:
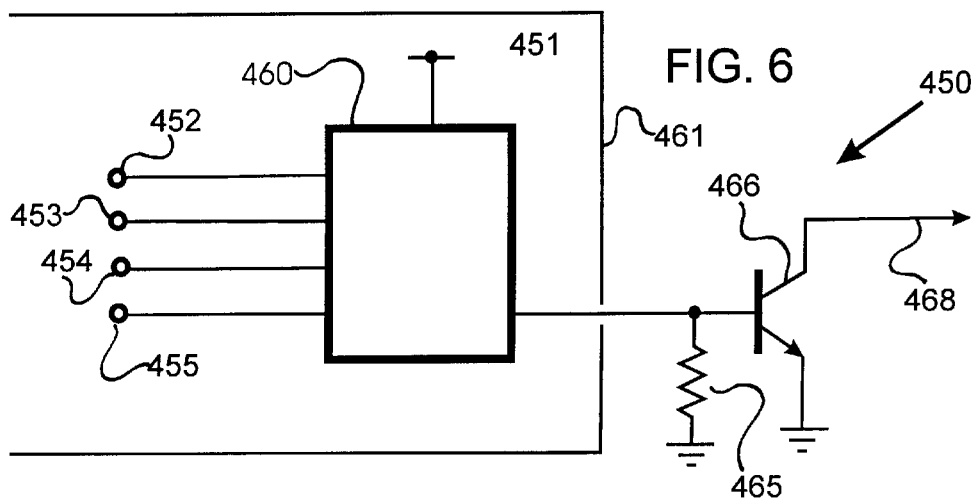
FIG. 6 illustrates the integration of the digital to analog converter to drive an external current driver transistor.
Figure 11:
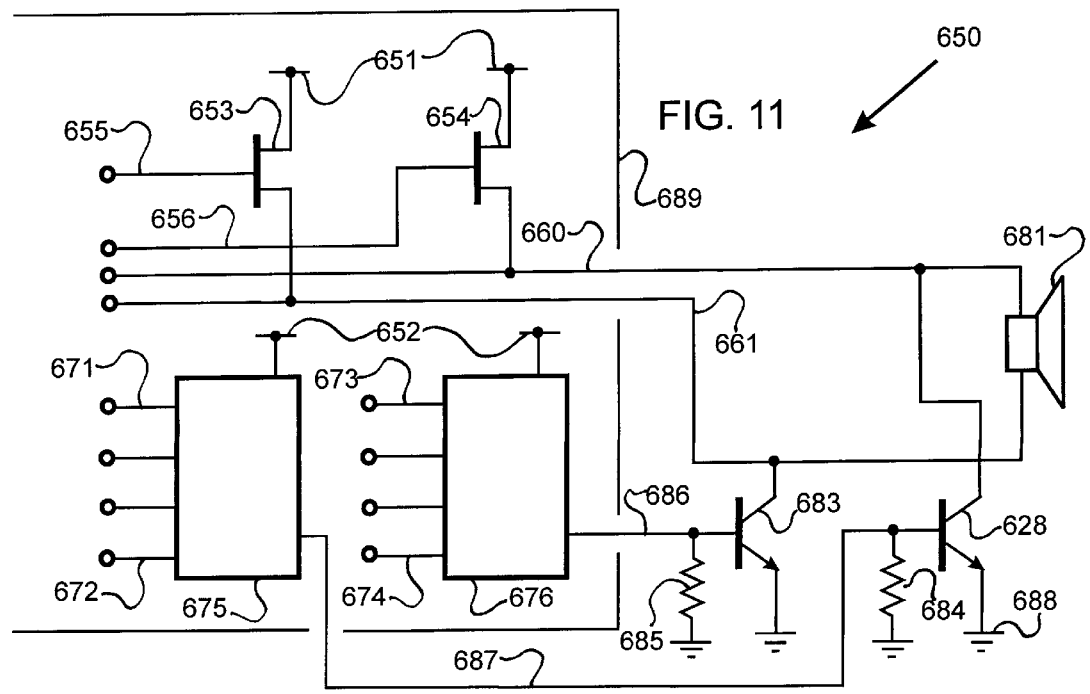
FIG. 11 is the enhancement of the embodiment of FIG. 10 to increase driving current with two external transistors.

It had been mentioned that the current driving or sinking capabilities of the DAC is limited, if higher power is required by the load, external power current drivers or amplifiers are to be added. This is illustrated in FIG. 6 where the block 406 represents the DAC 400 or 420. The external transistor 466 locates outside the IC 461 amplifiers the current obtained from the DAC 460. The operation is then identical to the single power transistors class A amplifier of FIG. 1. In the situation of FIG. 11, two current amplifying transistors 683 and 628 locates outside the IC 689 are added to interface between the DACs 676, 675 and the load 681. In the direct drive embodiment of FIG. 10, assuming the single power supply voltage 601 is of three batteries having 4.5V operating voltage, the impedance of the speaker 612 is 100 ohm, the maximum current to be handled by the switches 603, 604 and DACs 623 and 624 are roughly 40 mA. In FIG. 11, assuming the speaker is changed to 8 ohm and the working beta of the transistors is 50, the current to be handled by the switches 653, 654 and DACs 675, 676 is roughly 10 mA only. As a result, with the external current driver, the area on the IC required to build the switches and the DACs is smaller and the cost of the IC is reduced. Another important consideration is the heat dissipation of the IC. The current regulating DACs 623, 633 are sharing the power supply voltage with the load during different signal locations of the waveform. The voltage sharing contributes to a lot of power dissipated on the DACs. External current amplifying is therefore desirable to resolve power dissipation of the IC design and further reduce the cost of the IC.

Figure 13:
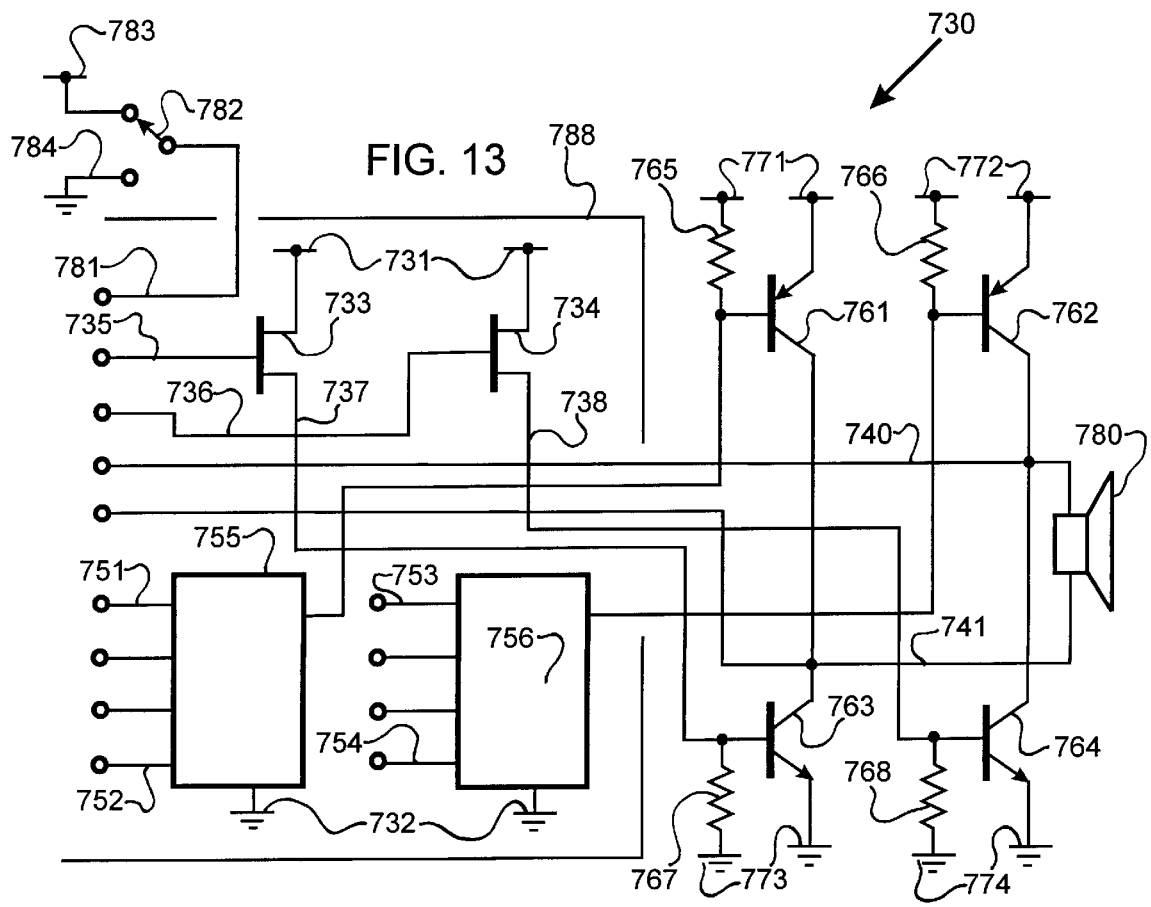
FIG. 13 is a further enhancement of the embodiment of FIG. 10.

NMOS and PMOS switches are not perfect switches as compared with the mechanical switches due to their turn on impedances. The current capable to be handled by the solid state switch is proportional to the size of the switch. In order to minimize the cost of making the IC, external current switches similar in arrangement to the transistors 683 and 628, are also recommended to interface between the load and the switches 653 and 654. The resulting circuit is illustrated in FIG. 13 where transistors 761, 762 external to the IC 788 are driven by DACs 755, 756 to source and control the analog signal current fed to the load 780. The switching transistors 763 and 764, also external to the IC 788, become current sinking switches to buffer the switches 733 and 734 built inside the IC 788. It is noted that the DACs 623, 633 of FIG. 10 and DACs 755 and 756 of FIG. 13 are all current sinking type while the DACs 675 and 676 of FIG. 11 are of current sourcing type. Similar to the analog signal control means represented by the DACs, the modified external power or current driving circuits may deliver driving currents both in the sourcing and sinking directions.

In FIG. 13, although two DACs 755 and 756 are provided to service the signal driving transistors 761 and 762, it should be noted that both the DACs 755 and 756 are never required to work at the same time. For that reason, it may be economical in a modified embodiment to have one single DAC connected to both signal driving transistors 761 and 762 through another switch such that during the relative positive period of the analog signal, the DAC is connected to the transistor 762 and during the relative negative period of the analog signal, the DAC is connected to the transistor 761.

FIG. 14 illustrates an alternate direct drive embodiment using four DACs. When compared with the embodiment of FIG. 10, DACs 801 and 803 replaces the switches 603 and 604. The circuit 800 although is more expensive than the circuit 600, has its merits. Firstly, it evenly distributes the power inside the IC by the DACs 803 and 802. Secondly, it is very suitable for dual channel operation such that two different analog signals are to be delivered to the same load 831. For an example in the relative positive operation, DAC 803 may decode a background music. DAC 802 may decode a singing voice. As a result, the two channels of sound will be mixed and delivered to the load. Special algorithm in decoding is required to make sure that when a channel is cut off, the corresponding DAC is half turned on to enable the current of the other channel to go through.

FIG. 15 is the corresponding external drive embodiment of system 800 shown in FIG. 14. Transistors 887, 888, 893, 894 located external to the IC form the current or power amplifiers to interface between the high power load 896 and the DACs 865, 866, 863 and 864. When compared with the embodiment of FIG. 11, the transistors 893 and 894, each shares around half the power when compare with that of transistors 683 and 628 of FIG. 11. As a result, smaller power transistors can be used in the design of FIG. 15 than that of FIG. 11. Alternatively, if the transistors of the same power are used, the embodiment of FIG. 15 is capable to deliver more power to the load 896 than that of FIG. 11.

Attention is now drawn to the mode selection switch 782 of FIG. 13. The mode selection switch allows the user to select between direct drive mode and external drive mode. When the switch 782 is on pull high position 783, the high signal is sent via path 781 to the front part micro-controller which in turn configure the switches 733, 734 and signal controlling DAC 755 and 756 to deliver higher current suitable for direct drive. If the mode selection switch is on pull low position 784, smaller driving currents are output to the output pins of the switches and the DACs just sufficient to drive the current buffering transistors 761, 762, 763 and 764. The dual modes configuration enables the same piece of sound or melody chip to drive either directly a high impedance load such as a 100 ohm head phone or when equipped with four transistors externally, to drive a low impedance load such as a 4 ohm or 8 ohm speaker. This arrangement saves cost to develop and keep stock of two identical functional ICs just to service different loading applications. It should be noted that the two operation modes are preferably designed to share the same output pins of the IC. While the switch 782 requires an additional pin out to select the output mode, in many applications the desirable output loading is already predefined during the development stage. In this case the mode selection pin 782 can be eliminated to reduce the cost of the IC. The mode selection can then be selected by a selection of masking option before the chip is fabricated.

Figure 12:
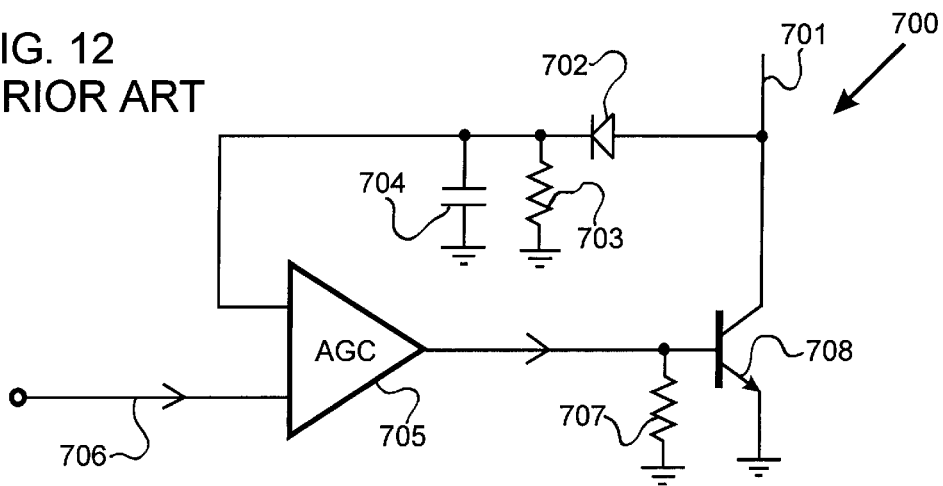
FIG. 12 illustrates a prior art example of the AGC circuit and feed back calibration circuit.

Since the impedance of the load may vary from application to application, the exact loading requirement may still be different. In order to let the circuit adjust for different loading requirements, current sharing resistors 765, 766, 763 and 764 are included to fine tune the driving base current directed to/from the signal switching/control transistors. In the situation when exact loading conditions are to be perfectly fine tuned, especially when the beta of the current amplifying transistors varies, it is desirable to provide two feed back signals 740 and 741 for the reference of the front end micro-controllers. The micro-controller may then adjust or fine tune the amplitude of the data fed to the DAC so that the error due to transistor beta variation is compensated. With successive fed back and correction method, the micro-controller is able to determine that output current is too high or too low and then fine tune the value of the DAC output to obtain the perfect waveform output across the load. FIG. 12 illustrates a typical prior art analog feedback and correction circuit. The actual voltage reading of the load is derived from the point 701 and fed back to the input of the AGC circuit 705. The peak of the output signal is collected by the diode 702 and charge up the capacitor 704 so as to control the gain of the input signal. Resistor 703 consistently discharges the capacitance of 704. In addition to FIG. 12, there are different feedback circuits well know in the art suitable for the error correction purpose. All these feed back and correction methods are considered to be within the scope of the subject patent application. The mode selection switch 902 in FIG. 15 offers the similar function to the switch 782 of FIG. 13. The feed back paths 897 and 898 offer the similar feedback function to the feedback paths 740 and 741 of FIG. 13.

Figure 7A:
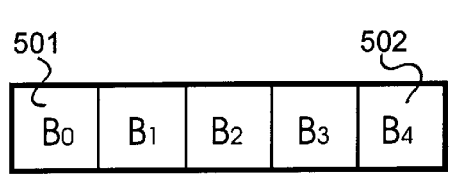
FIG. 7A illustrates a traditional bit assignment of a PCM sample.
Figure 7B:
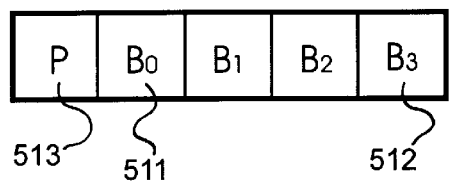
FIG. 7B illustrates the modified bit assignment of the PCM sample to support the invention.
Figure 9:
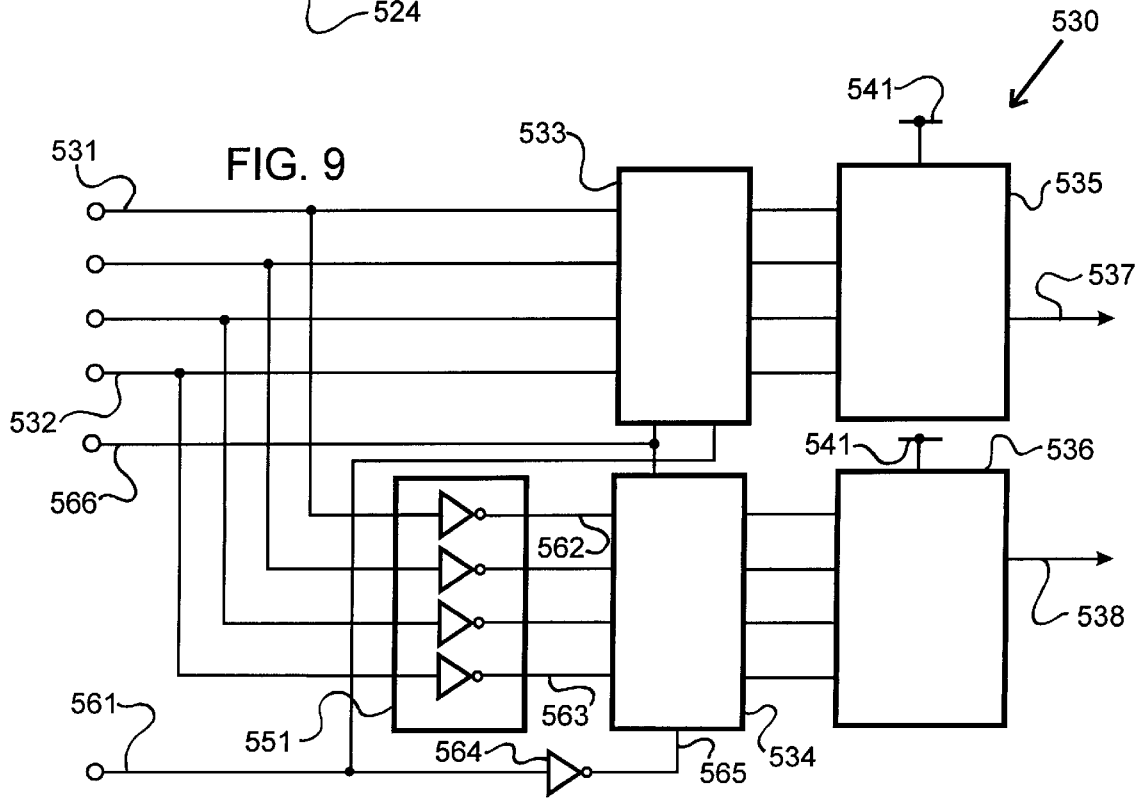
FIG. 9 is an embodiment of the invention to work with traditional PCM encoded data.

Attention is now drawn to FIG. 7A, which illustrates a typical 5 bits PCM encoded sample of an analog signal. The analog signal is sampled by a sampling frequency of j kHz. Each encoded sample is defined by a 5 bits word. Bit B0, 501 is the most significant bit and bit B4, 502 is the least significant bit. This PCM encoding arrangement, although commonly utilized in the art to encode an analog signal, is not readily applicable to the analog push-pull circuits invented. In order for the data to be applicable to service the different preferred embodiments previously discussed, a neutral level is firstly to be defined. Then a sign bit describing whether the signal is in the relative positive region or the negative region is required. Thirdly, a modified PCM code representing the amplitude of the analog signal in the relative positive or relative negative portion is required. For an example in a 5 bits PCM code, it is convenient to define the neutral level to be the level represented by the mid point PCM code 10000. Any signal equal or greater than 10000, that is between the 10000 to 11111 range, is defined to be in the relative positive region. Any signal between the 00000 to 01111 values are considered to be in the relative negative region. FIG. 9 illustrates a hardware circuit converting a standard PCM code into a format suitable to drive the different embodiments previously discussed. Preferably the modified PCM encoded data is in the format illustrated in FIG. 7B. The first sign bit P represents the polarity or sign bit to tell if the signal is in the relative positive region or in the relative negative region. The remaining four bits B0 to B3 describes the amplitude of the sample. In converting the standard PCM code of FIG. 7A into the modified code of FIG. 7B, bit B0 501 is conveniently defined as the sign bit. B1 to B4 corresponds to B0 to B4 of 510 represents the amplitude of the sample when it is in the relative positive region. However, when B0 is zero, the data B1 to B4 of 500 does not represent the amplitude of the analog signal during the relative negative region. This is because B1 to B4 represents the amplitude of the signal measured from the 00000 level and not from the 10000 level. In order to obtain the absolute amplitude measured downward from the 10000 neutral level, the data B1 to B4 are to be inverted. Attention is now drawn to FIG. 9. The four pins 531 to 532 represents B1 to B4 of the word 500 respectively. Pin 566 is the gating signal when a sample is gated. 533 is a latch to receive and hold the four bit data during the relative positive period. These 4 bits of data are then fed to the DAC 535 which provides the amplitude of the output signal during the relative positive region. The similar data 531 to 532 are inverted by the inverters 551. The inverted data 562 to 563 represents the absolute amplitude of the signal during the relative negative region, measured from the neutral level 10000. These data bits are then latched and held by the latch 534. DAC 536 receives the data from the latch 534 and provides an analog signal represents the amplitude of the signal during the relative negative region. Polarity signal 561 represented by the sign bit P is fed to enable the latch 533. The sign bit is also fed to the inverter 564 to provide the enable signal 565 for the negative portion latch 534. When interfaced with the embodiment 650 of FIG. 11, DAC 535 corresponds to DAC 675 of 650. DAC 536 corresponds to DAC 676 of 650. The polarity bit 513 represented by the pin 561 and its inverted signal 565 are delivered to pins 655 and 656 of the embodiment 650 illustrated in FIG. 11, to turn on one of the switches 653 and 654 at a time. It should be noted that the converting circuit illustrated in FIG. 9 is exemplary, various modifications or alternate designs are possible to achieve the similar results. For example, the conversion mechanism can be performed by a microprocessor with properly arranged software. All these modifications or alternate design servicing the similar function are considered to be within the scope of the present invention.

Figure 8:
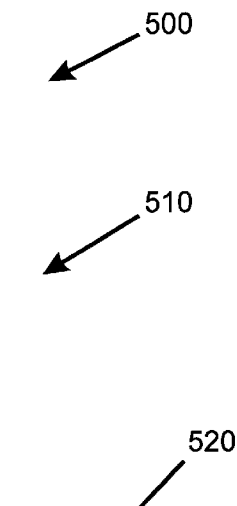
FIG. 8 illustrates a decoder to decode delta modulation encoded data.

The above example illustrates how an encoded signal is converted into a format suitable to work with the invented embodiments. The similar principle is applicable to most other different kinds of encoding and decoding algorithms such as DM (delta modulation); ADM (adaptive delta modulation) and ADPCM (adaptive delta PCM). Any different kind of encoding and decoding when modified to work with the principles of the disclosed embodiment are considered to be within the scope of the invention. FIG. 8 discloses a decoder to decode a delta modulation. Functional block 522 is an accumulator or up/down counter configured to add or subtract a delta value supplied by the data source 524. Terminal 521 provides a sign bit which instructs the accumulator to add or subtract its original value with the delta value supplied by 524. The resulted data 523 is a floating signal which is then supplied to a DAC for converting an analog signal. Although the neutral level for a delta signal is undefined according to the nature of delta modulation or its other modified algorithms, eventually the decoded delta modulation data are to be sent to a DAC for converting into an analog signal. As a result, the neutral level can conveniently be defined as the middle point of the dynamic range of the DAC. All DAC designs are limited by an absolute maximum value. For example, in the situation of a 8 bits DAC, the neutral middle level can be defined as 10000000 and the code modification method described in the PCM decoding system discussed above can be implemented to modify the DM encoded data into format suitable for servicing the invented embodiments. The decoding means referred by the claims are defined by any hardware, software or combination of hardware and software configured to decode digital data suitable for a DAC to rebuild an analog signal. The D/A converting means are defined by any hardware, or combination of hardware and software capable to rebuild an analog signal from samples of digital data.

With the above example, it is observed that a code modification system, by hardware, software or by the combination of both hardware and software, is required to rearrange the data such that they are applicable to the disclosed push-pull driving embodiments. Such rearrangement involves the process to provide a polarity signal or sign signal; and an amplitude data. It is an objective of the invention to provide a modification supplement to any encoding algorithm, such that during decoding, the necessary elements required by the system (the sign bit and the amplitude data) are readily available. This improvement will eliminate the cost required to modify the decoding circuit. The economic advantages can be easily observed by knowing that in most applications, the encoding process is required to be done only once but the decoding work will be required to be performed repeatedly in every retail unit containing the decoder. In the situation of PCM, it is therefore preferable to modify the data format from the tradition format shown in FIG. 7A to that of the modified format shown in FIG. 7B before the data are stored in memory ready for decoding. It should be note that the memory storage means storing any digitally encoded data covers all different kinds of memory capable to hold digital data. The example of these memories including but not limited to RAM, ROM, magnetic storage memory, diskette, tape, CD ROM, flash memory and analog CCD memory.

What is claimed is:

1. A signal driving circuit responsive to an analog signal having at least a relative positive portion of waveform and a relative negative portion of waveform comprising:

a load;

first and second analog signal control means responsive to said analog signal for controlling the current passing through said load;

first switching circuit means configured to conduct current flow through said first analog signal control means and said load during said relative positive portion of waveform in a first direction; and second switching circuit means configured to conduct current flow through said second analog signal control means and said load during said relative negative portion of waveform in a second opposite direction.

2. The signal driving circuit of claim 1 wherein said first and second switching circuit means are located inside a first integrated circuit and said first and second analog signal control means are located outside said integrated circuit.

3. The signal driving circuit of claim 1 further comprising polarity signal control means configured to turn on at most one switching circuit means at a time.

4. The signal driving circuit of claim 1 further comprising memory storage means storing digitally encoded data representing said analog signal and at least one D/A converter to convert said digital data into an analog signal.

5. The signal driving circuit of claim 4 wherein said D/A converter is directed to control the current flowing through said first analog signal control means during said positive portion of waveform and the current flowing through said second analog signal control means during said negative portion of waveform.

6. The signal driving circuit of claim 4 comprising at least two D/A Converters wherein the first D/A converter is configured to control the current flowing through said load during said positive portion of waveform and the second D/A converter is configured to control current flowing through said load during said negative portion of waveform.

7. The signal driving circuit of claim 4 comprising at least four D/A converters wherein the first and second D/A converters are configured to control the current flowing through said load during said positive portion of waveform and the third and fourth D/A converters are configured to control the current flowing through said load during said negative portion of waveform.

8. The signal driving circuit of claim 4 wherein said digitally encoded data comprises information directing which switching circuit means to turn on.

9. The signal driving circuit of claim 4 further comprising polarity signal control means to derive polarity signal from said digitally encoded data and to direct which switching circuit means to turn on.

10. The signal driving circuit of claim 9 further comprising a processor to derive said polarity signal by software.

11. The signal driving circuit of claim 1 wherein one of said analog signal control means is a D/A converter.

12. The signal driving circuit of claim 1 wherein one of said signal control means comprises one or more switches.

13. The signal driving circuit of claim 1 further comprising at least a first external power driver, said first external power driver is configured to interfaced between said external load and one of said switching circuit means or analog signal control means.

14. The signal driving circuit of claim 1 further comprising a dual mode driving circuit configured to provide two different sourcing or sinking current drives suitable for the direct drive mode and the external power drive mode.

15. The signal driving circuit of claim 14 further comprising a mode selection circuit to select the direct drive mode or the external power drive mode.

16. The signal driving circuit of claim 1 wherein each switching circuit means is also a signal control means capable of providing the switching function.

17. The signal driving circuit of claim 1 further characterized in that the circuit is configured to work with a single power supply to provide current flowing through said load in both directions.

18. A signal reproducing apparatus comprising:

memory storage means storing digitally encoded data representing an analog signal;

a load;

decoding means and D/A converting means configured to restoring the analog signal represented by said digitally encoded data;

first signal driving circuit means configured to feed a first portion of analog current representing said analog signal through said load in a first direction; and second signal driving circuit means configured to feed a second portion of analog current representing said analog signal through said load in a second opposite direction.

19. The signal reproducing apparatus of claim 18 wherein said decoding means and D/A converting means further configured to provide a polarity signal in accordance to said digitally encoded data; wherein said polarity signal activates one of said signal driving circuit means at a time.

20. The signal reproducing apparatus of claim 18 wherein said D/A converting means comprises a first D/A converter and a second D/A converter; wherein said first D/A converter is directed to control said first signal driving circuit means and said second D/A converter is directed to control said second signal driving circuit means.

21. The signal reproducing apparatus of claim 18 wherein said first and second signal driving circuit means are integrally structured with said D/A converting means.

22. The signal reproducing apparatus of claim 18 wherein said D/A converter means locates inside an integrated circuit and any of said signal driving circuit means locates outside said integrated circuit.

23. The signal reproducing apparatus of claim 18 further comprising a dual mode driving circuit configured to provide a first driving current suitable for the direct drive mode and a second driving current suitable for the external power drive mode.

24. The signal reproducing apparatus of claim 18 further comprising a mode selection circuit to select the direct drive mode or the external power drive mode.

25. The signal reproducing apparatus of claim 18 wherein said digitally encoded data comprises of m words of data and each words comprises of n bits of data; wherein one bit of each word is specifically assigned as a sign bit to identify the direction of the analog current flowing through said load.

26. The signal reproducing apparatus of claim 25 wherein the m words of data represents m samples of said analog signal; the amplitude of each sample is represented by n−1 bits of data and the direction of analog current flowing through said load is represented by said sign bit.

27. A method to configure a signal driving circuit responsive to an analog signal having at least a relative positive portion of waveform and a relative negative portion of waveform to drive a load, said method comprises the steps of:
1. arrange a first and second analog signal control means responsive to said analog signal for controlling the current passing through said load;
2. arrange first switching circuit means to conduct current flow through said first analog signal control means and said load during said relative positive portion of waveform in a first direction; and
3. arrange second switching circuit means to conduct current flow through said second analog signal control means and said load during said relative negative portion of waveform in a second opposite direction.

28. The method of claim 27 wherein said analog signal is decoded from digital data having m samples, the digital data of each sample represents the amplitude and polarity of said analog signal; said method further comprising the steps of:
4. arranging one or more D/A converters to convert said digital data into said analog signal;
5. arranging a circuit to activate said switching circuit means in accordance to the polarity information of each sample.

29. The method of claim 28 wherein at least one of said switching circuit means is a D/A converter of step 4.

30. The method of claim 27 further comprising a step to include a feedback circuit configured for compensating the signal delivered to the load.

31. The signal driving circuit of claim 1 further comprising a feedback circuit configured for controlling the signal delivered to the load.

32. The signal reproducing apparatus of claim 18 further comprising a feedback circuit configured for controlling the signal delivered to the load.

* * * * *